United States Patent [19]

Suzuki et al.

[11] Patent Number: 5,025,348
[45] Date of Patent: Jun. 18, 1991

[54] BONDING STRUCTURE OF AN ELECTRONIC DEVICE AND A METHOD FOR MANUFACTURING THE SAME

[75] Inventors: Satoshi Suzuki; Osamu Kuwabara; Jiro Muto; Eiichi Shinozaki, all of Tokyo, Japan

[73] Assignee: Casio Computer Co., Ltd., Tokyo, Japan

[21] Appl. No.: 272,136

[22] Filed: Nov. 14, 1988

[30] Foreign Application Priority Data

Nov. 20, 1987 [JP] Japan .................. 62-292151
Apr. 20, 1988 [JP] Japan .................. 63-95448

[51] Int. Cl.⁵ .............................. H05K 1/00
[52] U.S. Cl. ...................... 361/398; 361/404
[58] Field of Search ........... 361/394, 398, 403, 404, 361/408

[56] References Cited

U.S. PATENT DOCUMENTS 3,855,693  12/1974  Umbaugh .................. 361/408
4,064,356  12/1977  Marler, Jr. et al. ............ 361/408
4,104,728   8/1978  Kasubuchi .
4,141,075   2/1979  Taylor, Jr. et al. .

FOREIGN PATENT DOCUMENTS 57-1250  1/1982  Japan .

Primary Examiner—Leo P. Picard
Assistant Examiner—Lincoln Donovan
Attorney, Agent, or Firm—Frishauf, Holtz, Goodman & Woodward

[57] ABSTRACT

A bonding structure and a bonding method for connecting an IC unit having an insulating sheet to connecting terminals arranged on a substrate. The insulating sheet has an elongated opening which is formed along one side of said insulating sheet and has on its one surface a plurality of conductive metal leads adhered thereto which stretch over the elongated opening. Portions of the metal leads which stretch over the elongated opening are solder-plated to serve as connecting portions. The connecting portions of the metal leads are heated and pressed into the opening with use of a heat-pressing head which has a width narrower than the opening, thereby being soldered to the connecting terminals. The metal lead is formed with inclined parts at its positions corresponding to both sides of the portion depressed by the heat-pressing head and solder pools are formed between the inclined parts and the connecting terminals. A bonding structure of high efficiency and high reliability is achieved for bonding IC unit with fine-pitch connecting-leads.

18 Claims, 5 Drawing Sheets

BONDING STRUCTURE OF AN ELECTRONIC DEVICE AND A METHOD FOR MANUFACTURING THE SAME

BACKGROUND OF THE INVENTION

1. Field of the Invention

This invention relates to a bonding structure of an electronic device and a method for manufacturing the same.

2. Description of the Related Art

IC units manufactured by TAB (Tape Automated Bonding) method have been known, in which the IC chip is bonded to metal lead foil adhered onto an upper surface of a resin film (carrier film). These IC units are used, for example, for electrically connecting a liquid crystal display panel to a printed circuit board and the like in table-top electronic computers. The IC chip which is used to connect the liquid crystal display panel and the printed circuit board serves for driving the liquid crystal device.

When the IC unit is used to electrically connect the liquid crystal display panel and the printed circuit board, the IC unit is required to ensure a steadfast connecting between the above components during a mounting work. Therefore, the IC-chip leads must be firmly bonded to the connecting leads of the liquid crystal display panel and the printed circuit board so that the IC-chip leads do not separate from the above connecting leads.

For ensuring the firm bonding of the IC-chip leads, one of the conventional technique is shown in Japanese patent unexamined disclosure 57-1250, which discloses that, in the bonding method of this type, the IC-chip leads extended from the IC-chip body are bent slightly down at its free end portions and these bent portions are further bent forward, thereby the extending leads being bent into a dull steplike shape. The bent portions of the IC chip leads are arranged on the connecting leads of the liquid crystal display panel and the printed circuit board, respectively solder is applied between the free ends of IC-chip leads and the above mentioned connecting leads to provide a solder pool between them, thereby ensuring the firm bonding between them enough for preventing the IC-chip leads from separating from the connecting leads.

The conventional technique mentioned above can not be suitably used in a structure where the extremely fine pitches and the narrow widths for the metal leads are required In such case, for preventing excess solder from flowing into the spaces between leads so as to make a short circuit, solder must be applied as little as possible while ensuring a high bonding strength. To achieve a firm soldering with a bit of solder, the amount of solder to be provided to each of metal leads must be measured with a high accuracy. When a bit of solder is provided for bonding, one solder pool is not enough for ensuring a firm bonding strength Further, each of metal leads must be as thin as possible just as foil. In this structure, however the metal leads are too flexible so that the free ends of the leads might be steady. Therefore, in the conventional method, another problem is that it is very hard to position the free ends of the metal leads in the right place.

SUMMARY OF THE INVENTION

It is, therefore, an object of the present invention to provide a novel and improved bonding structure of an electronic device, which is suitably used for bonding a plurality of metal leads arranged with extremely fine pitches.

According to the present invention, a bonding structure of an electronic device comprising: an insulating sheet having portion defining a connecting opening; an electronic device having a plurality of electrodes arranged at its side edge;

a plurality of electric conductive metal leads carried on one surface of said insulating sheet, having ends electrically connected to said electrodes of said electronic device at their one end and having in the vicinity of the other end connecting portions which are received in said connecting opening, said connecting portions being deformed so as to have a level part facing to the other surface of said insulating sheet and two inclined parts adjacent to said level part, which inclined parts rise up towards the upper edge of the wall of said connecting opening;

a plurality of connecting terminals facing said connecting portions of said metal leads, respectively; and soldering layers for bonding said connecting portions of said metal leads and said connecting terminals each other, said soldering layers including two pools which increases thickness of layer along said inclined parts of said metal leads.

BRIEF DESCRIPTION OF THE DRAWINGS

These and other objects and features of the present invention can be understood by reference to the accompanying drawings, in which.

PREFERRED EMBODIMENT

An embodiment of the present invention will be described hereinafter with reference to FIGS. 1 through 8.

Figure 1:
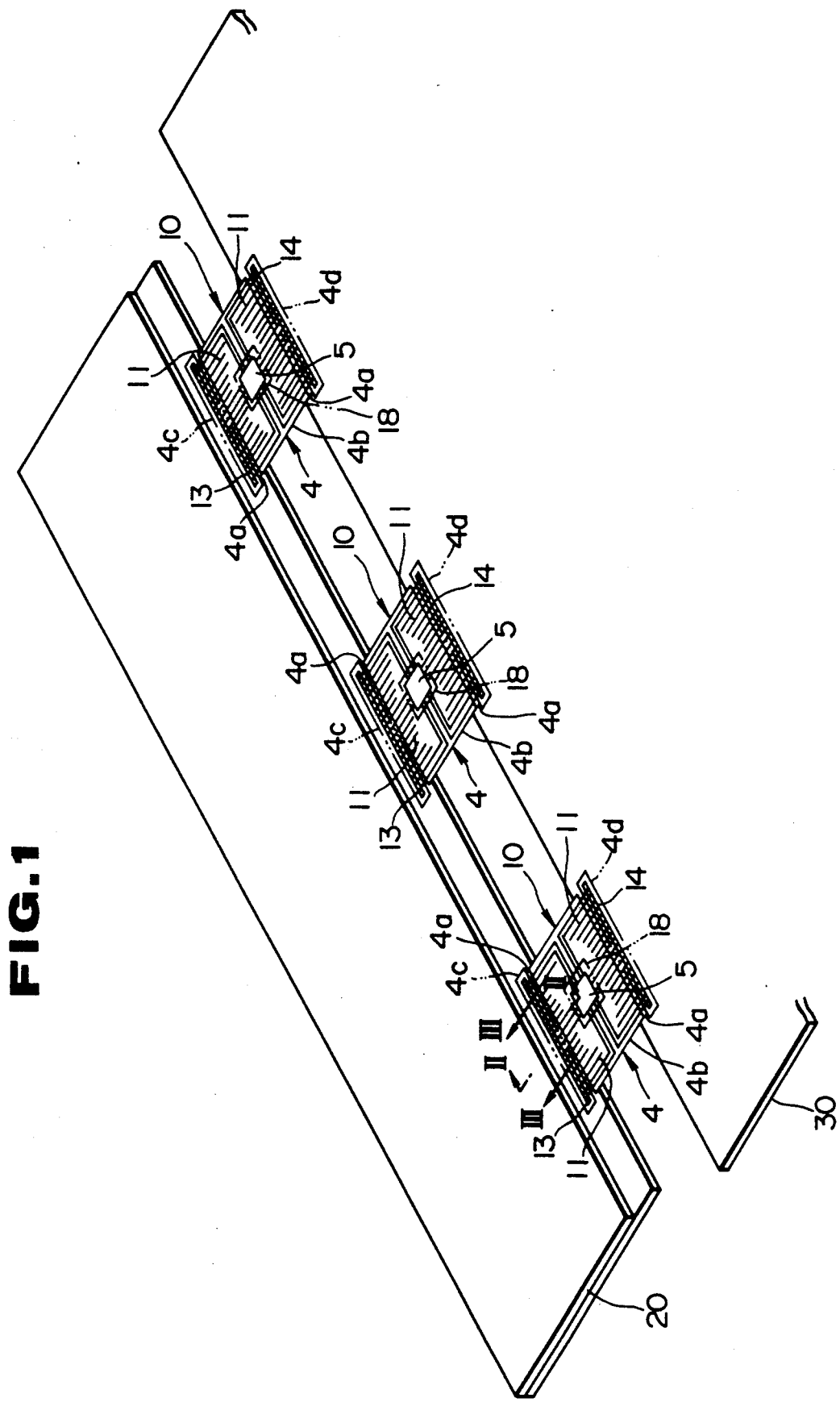
FIG. 1 is a perspective view showing a preferred embodiment where a liquid crystal display panel and a printed circuit board are connected by an IC unit which has an IC chip enclosing a display driving circuit.

FIG. 1 shows a state where IC units of TAB type connect a liquid crystal display panel and a printed circuit board used in a table-top electronic computer or the like. Several IC units 10 are arranged stretching over a liquid crystal display panel 20 and a printed circuit board 30 (three IC units are used in the present embodiment) to electrically connect them. The IC unit 10 includes a drive circuit which drives the liquid crystal display panel 20 to optically display a certain information on it in accordance with a control signal transferred from a cpu (not shown) through the printed circuit board 30.

Figure 2:
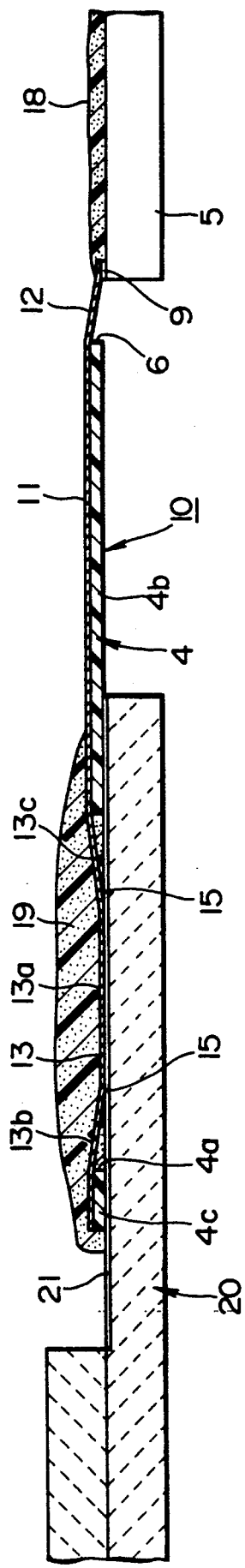
FIG. 2 is an enlarged sectional view taken along section line II—II shown in FIG. 1.
Figure 3:
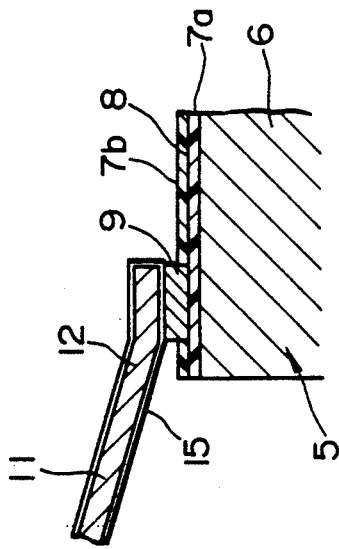
FIG. 3 is an enlarged fragmentary view showing a part of a bonding structure of an IC chip and a metal lead.

As shown in FIGS. 1 and 2, a carrier film ( a resin film) 4 is provided with an opening 6 which is larger than an outward shape of the IC chip 5 and is also provided with metal lead patterns (IC-chip leads) 11 on its upper surface. The metal leads 11 are adhered on the upper surface of the carrier film extended inside the opening 6, and the extended portions 12 of the metal leads 11 are bonded to the IC chip 5 by means of ILB (Inner Lead Bonding) method, whereby the IC unit is completed. On the other hand, connecting portions 13 and 14 of the metal leads 11 are bonded to the liquid crystal display panel 20 and also to the printed circuit board 30 by means of OLB (Outer Lead Bonding) method, respectively. The carrier film 4 comprises a flexible insulating film which is composed of macromolecule materials such as polyester, polyimide and the like. The carrier film 4 has a thickness of 50 to 200 $\mu$m and has two elongated openings 4a which are formed along both the sides of the carrier film in parallel one another. The carrier film 4 is partitioned into three portions by the two elongated openings 4a: a central portion 4b where the IC chip 5 is connected; two side portions 4c and 4d. Metal leads 11 are formed from a single metal foil (e.g. electrolytic copper foil of 35mm thick) which laminated to the carrier film 4 and etched, so called, a photo-etching process. As shown in FIG. 3, a silicon nitoride film 7a is formed on the upper surface of a semi-conductor silicon-wafer 6. Internal electrodes such as gate circuits (not shown) and wiring patterns 8 of aluminum which lead the internal electrodes to the peripheral portion of the silicon wafer are formed on the upper surface of the silicon nitoride film 7a. The bump electrodes 9 of gold are mounted on the wiring patterns 8. A silicon oxide film (insulating film) 7b is formed all over the wiring patterns 8 and the internal electrodes except the bump electrodes 9, whereby the IC chip bonded to end portions 12 of the metal leads 11 is completed. The bump electrodes 9 of the IC chip 5 are bonded to the end portions 12 of the metal leads 11 through the solder layers 15 plated to metal leads 11, as shown in FIG. 2, a part where the IC chip 5 has the bump electrodes 9 is covered with a resin 18. The solder plating layer 15 is composed of a compound of tin (Sn) and lead (Pb) (Sn: Pb=8~9:1~2) and covers all over the outer surface of the metal leads 11.

While, the carrier film 4 is provided with elongated openings 4a of 1 to 2mm wide which are formed along the film side edge, another words, in a normal direction to the metal leads 11. The above metal leads 11 are disposed on the upper surface of the carrier film 4 with their connecting portions 13 and 14 traverring the openings 4a. As shown in FIG. 2, the connecting portions 13 of the metal leads 11 plated solder layers 15 and extended towards the liquid crystal display panel 20 are bonded by means of a heat-pressing method to the connecting terminals 21 of the liquid crystal display panel 20. The central parts 13a of the connecting portions 13 which faces the opening 4a goes into said opening 4a. A both sides of the central parts 13a, the metal leads 11 are formed two inclined parts 13b and 13c which rise up gradually towards the upper edge of the opening walls 4a, as shown in FIG. 2. Solder pools 16a and 16b of a triangle shape as viewed in the sectional view of FIG. 2 are formed under the inclined parts 13b and 13c of the metal leads 11. Under these solder pools, the connecting portions 13 of the metal leads 11 are firmly bonded to the connecting terminals 21 of the liquid crystal display panel 20. And the connecting portions 13 of the metal leads 11 which are connected to the connecting terminals 21 of the liquid crystal display panel 20 are covered with silicon-gum adhesive 19, as shown in FIG. 2.

The connecting portions 13 and 14 are to be connected to different electronic parts, respectively, namely, either to the liquid crystal display panel 20 or to the printed circuit board 30, but they are bonded in a similar bonding structure and also in a similar bonding method. Therefore, only the connecting portions 13 of the metal leads 11 will be described hereinafter as the embodiment of the present invention.

Each of the solder plating layers 15 covering the above mentioned metal leads 11 has different thicknesses at the internal portion 12 to be connected to the bump electrode 9 of the IC chip 5 and at the connecting portion 13 to be connected to the connecting terminal 21 of the liquid crystal display panel 20. That is, excess solder put on the connecting portion 13 of the metal lead may cause a short-circuit between the adjacent metal leads, so that it is preferable to apply less solder on the metal lead. But the firm bonding has to be achieved with less solder. In the bonding structure of the connecting portion 13 of the metal lead 11, the solder melted down from the solder plating layer 15 flows not only into between the central part 13a of the metal lead 11 and the connecting terminal 21 of the display panel 20 but also into between the inclined parts 13b, 13c and the connecting terminal 21 so as to form solder pools 16a and 16b between them, thereby ensuring an adequate bonding strength. In the present embodiment the thickness of the solder-plating layer 15 of the connecting portion 13 is selected to be 0.8 to 2.0 $\mu$m. The internal portions 12 of the metal leads 11 are bonded to the IC chip 5 by means of the heat pressing method while the bomb electrodes 9 of the IC chip 5 is heated to 400° C. for 0.5 to 1 sec. In this case, the solder plating layers 15 are selected to be 0.2 to 0.6$\mu$m thick so as to obtain the maximum bonding strength of the gold-tin eutectic.

Figure 4:
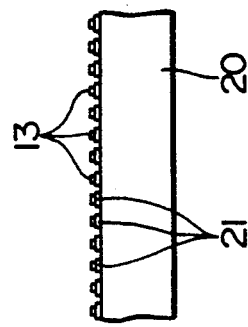
FIG. 4 is an enlarged sectional view taken on line III—III shown in FIG. 1.
Figure 6:
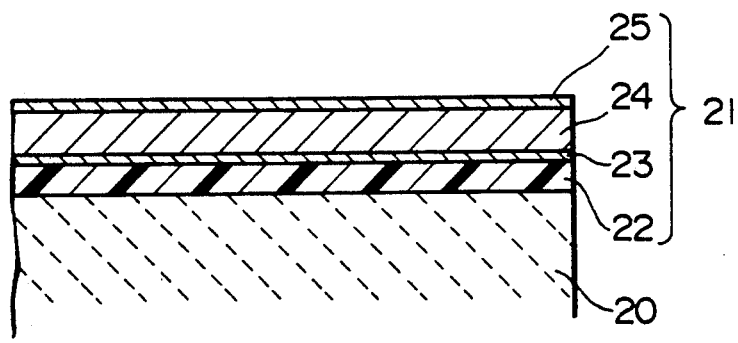
FIG. 6 is an enlarged fragmentary sectional view of a connecting terminal of a liquid crystal display panel.

The connecting terminals 21 of the liquid crystal display panel 20 which are to be bonded to the connecting portions 13 of the metal leads 11 with solder melted down from the solder-plating layer 15 are evenly spaced at the end portion of the liquid crystal display panel 20 as shown in FIG. 4. As shown in FIG. 6, each of the connecting terminals 21 of the liquid crystal display panel 20 has a lamination structure of an oxide silicon layer 22 with a thickness of approximately 1000Å formed on the upper surface of the liquid crystal display panel 20, an ITO (Indium Tin Oxide) layer 23 with a thickness of approximately 350Å formed on the upper surface of the oxide silicon layer 22, a Au(gold) layer (non-electroplating) 24 with a thickness of approximately 2000Å formed on the upper surface of the layer 22 and an Au layer (non-electroplating) 25 of a thickness of approximately 500Å further formed on the upper surface of the layer 24. These layers 22 to 25 are formed by means of the metal depositioning method or the sputtering method.

Figure 5:
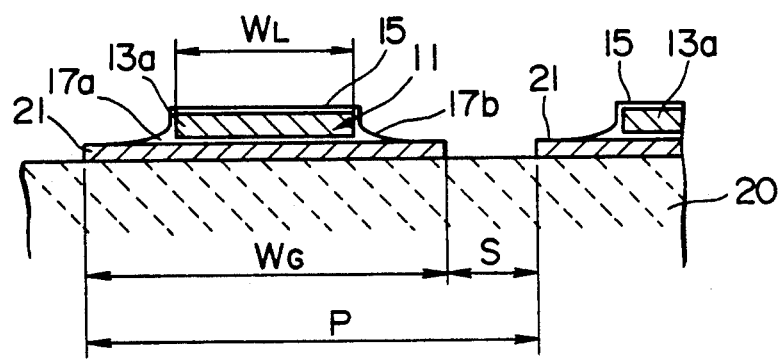
FIG. 5 is an enlarged view of a main part of FIG. 4.

The construction of the connecting portions 13 of the metal leads 11 and the connecting terminals 21 to be bonded thereto is shown in FIG. 5. That is, the pitch P of the metal leads 11 is selected to be 150$\mu$m and width of metal lead 11 WL 60 to 80 $\mu$m. The distance S between the connecting terminals 21 is selected to be 30μm and width of the connecting terminal 21 WG 120μm. Being defined as WG>WL, solder melted down from the solder plating layer 15 flows to the side edges in the direction of the width of the metal lead 11 so as to form solder pools 17a and 17b of a nearly triangle shape at both sides of the metal lead 11, thereby the peeling strength of the metal lead 11 in the direction of the width of the metal lead 11 is reinforced. And being the relation of WG>WL, the solder plating layer 15 spreads over on the surface of the connecting terminal 21 but not to spaces between terminals 21 during the heat-pressing work. Thereby adjacent metal leads 11 are prevented from making a short-circuit. It is recommended that the width WL of the metal lead 11 should be selected to be 0.5 to 0.8 times as wide as the width WG of the connecting terminal 21 so as to make clearances of 0.25 to 0.1 times the width WG at both sides of the metal lead 11.

A manufacturing method of the IC unit of the above mentioned structure will be described hereinafter.

In the first process a metal foil is laminated on the carrier film 4 which is provided with openings 6 and 4a and then the metal foil is etched so as to have a predetermined metal leads by means of the photo etching technique. In the second process, all of the outer surface of the metal leads 11 are plated with solder. Each of the solder plating layer 15 is 0.2 to 0.6 μm thick. The inner edge portions 12 of the metal leads 11 are bonded to the IC chip 5 in the third process. In the forth process, resin 18 is applied on the IC-chip surface on which the bump electrodes 9 are formed. In the following fifth process, the resin 18 applied on the IC chip 5 is dried in an atmosphere of 150° C. for about 3 hours. In the sixth process, the outer edge portions 13 of the metal leads 11 are plated with solder again so as to produce solder plating layers 15 of a thickness from 0.2 to 2.0 μm. The reason for re-plating the connecting portions 13 after the drying process of the resin 18 in the fifth process is that tin contained in the solder plating layers 15 would somewhat crystallize with copper of the metal leads 11 during the drying process in the fifth process, and the thickness of the solder plating layers 15 would be decreased to 0.1 through 0.2 μm. Concerning the above matter, it is a possible way, in the second process, to plate electroplate to the connecting portions 13 with the estimated amount of solder which was added amount of the decreasing during the drying process of the resin 18. And the seventh process, solder flux is applied on the connecting portions 13 of the metal leads 13.

A bonding method will be described hereinafter, for bonding the metal leads 11 of the IC unit 10 manufactured in the above mentioned manner to the connecting terminal 21 of the liquid crystal display panel 20.

Figure 7:
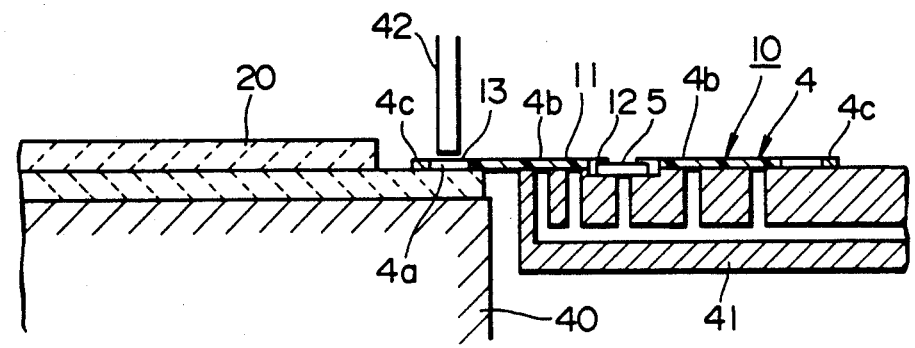
FIG. 7 is a sectional view useful in describing a bonding method according to the present invention.
Figure 8:
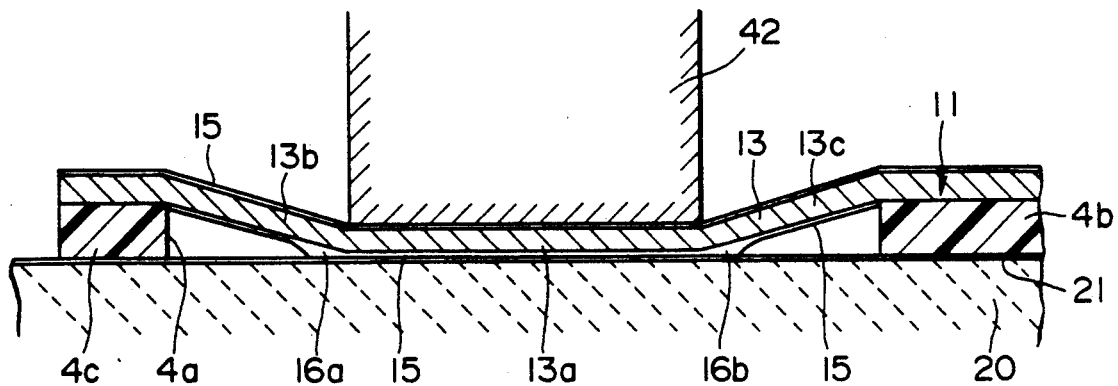
FIG. 8 is an enlarged view showing a main part of FIG. 7.

As shown in FIG. 7, the liquid crystal display panel 20 is put on a table 40 with the connecting terminals 21 upwards. And then, the IC unit 10 is taken up by a vacuum suction head (not shown) for positioning the connecting portions 13 of the metal leads 11 so as to meet with the connecting terminals 21 of the liquid crystal display panel 20. After the positioning the IC unit, the IC unit is held in place by another vacuum suction device 41 and the former vacuum suction device (not shown) is released from the IC unit 10. In this case, the carrier film 4 of the IC unit 10 is put on the display panel 20 with the metal leads 11 upwards. The connecting portions 13 of the metal leads 11 are arranged so as to face the connecting terminals 21 of the display panel 20 through the opening 4a formed in the carrier film 4, with distance corresponding to the thickness of the carrier film 4, as shown in FIG. 7. The end portions of the metal leads 11 are fixed on the side portion 4c of the carrier film 4 so that the metal leads 11 are held at a predetermined pitch. And then the heat pressing head 42 which was prepared above the table 40 is lowered to depress the central portions 13a of the connecting portions 13 onto the connecting terminals 21 of the liquid crystal display panel 20, as shown in FIG. 8.

The heat-pressing process by means of the heat-pressing head 42 will be described. As the central portions 13a of the connecting portions 13 are pressed into the opening 4a in the carrier film 4 by the head-pressing head 42, each of the connecting portions 13 of the metal leads 11 will be deformed to have two inclined portions 13b and 13c at both sides of the depressed central portions 13a. That is as the central portions 13a of the metal leads 11 are lowered towards the connecting terminals 21 by the heat-pressing head 42 as shown in FIG. 8, inclined portions 13b and 13c are formed on the each of metal leads 11 at both sides of the central portions 13a. Namely the inclined portions 13b and 13c rise up gradually towards the upper edge of the opening 4a in the carrier film 4. As the metal leads 11 are plated with solder, the solder plating layers 15 are melted down by heat of the heat pressing head 42. Thus melted solder flows into the root portions of the inclined portions 13b and 13c of each of the metal leads 11. At this time, because the upper surfaces of the connecting portions 13 of the metal leads 11 are heated by the heat pressing head 42, the melted solder flowed into the root portions of the inclined portions 13b and 13c gradually rises along the inclined portions 13b and 13c, and forms the solder pools 16a and 16b which are nearly triangle shape defined by each of the connecting terminals 21 of the display panel 20 and the inclined portions 13b and 13c of each of the metal leads 11. These solder pools 16a and 16b reinforce the bonding strength between each of the connecting portions 13 and each of the connecting terminals 21. Also, the solder melted down from the solder plating layers 15 is spread over on the surface of each of the connecting terminals 21 and, thus, forms the solder pools 17a and 17b of nearly triangle shape at both sides in the width direction of each of the metal leads 11 as shown in FIG. 5. Accordingly, each of the metal leads 11 is prevented from being peeled off in its width direction and is firmly bonded to each of the connecting terminals 21 of the display panel 20. After the metal leads 11 are bonded to the connecting terminals 21 in the above mentioned manner, the bonding or joint portions are covered with silicon gum adhesive 19.

The heat pressing head 42 is 0.5 to 0.8 times as wide as that of the opening 4a (1 to 2mm) in the carrier film 4. The metal leads 11 are bonded to the connecting terminals 21 subjected to a treatment under temperature of the applied heat from 200° to 400° C., applied pressure from 30 to 360 g/mm$^2$, for a period 1 to 5 sec.

Figure 9:
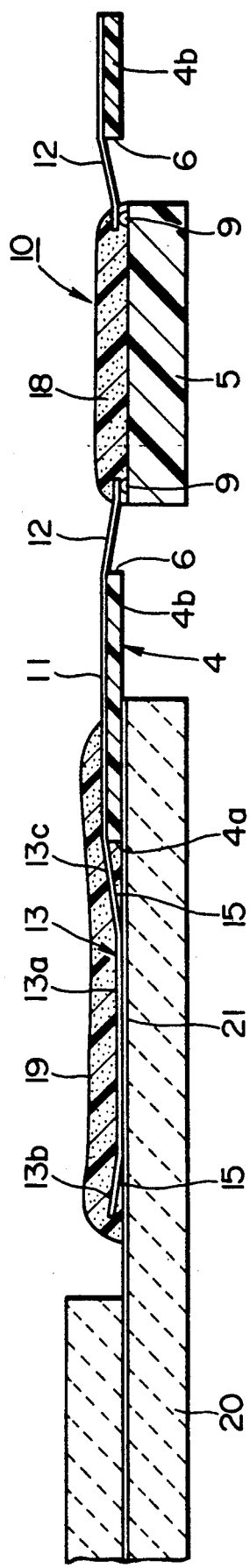
FIG. 9 is an enlarged sectional view of other embodiment according to the present invention.
Figure 10:
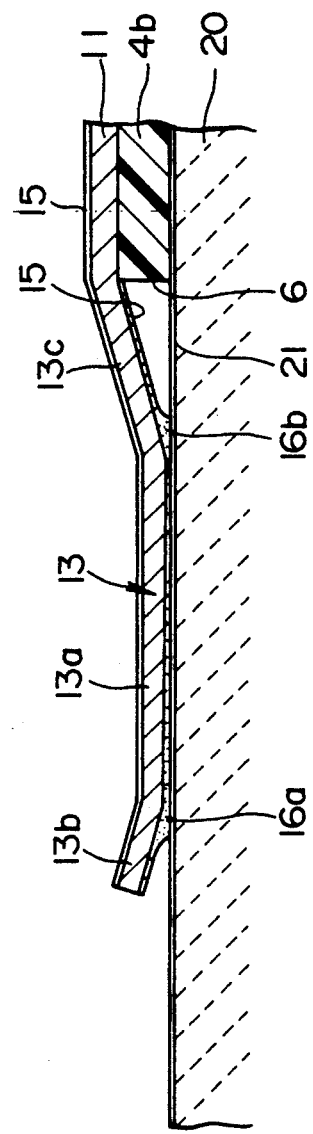
FIG. 10 is an enlarged view showing a main part of other embodiment shown in FIG. 9.

FIGS. 9 and 10 show other embodiment of the present invention. In this embodiment, like reference symbols represent like elements of the first embodiment and a further description thereof will be omitted.

In the second embodiment, as may be clear in comparison with the first embodiment, the carrier film 4 lacks the side portion 4c (or 4d). That is, in the second embodiment, after the connecting portions 13 of the metal leads 11 are soldered to the connecting terminals 21 of the display panel 20, the metal leads 11 are sheared at the inclined portions 13b with scissors or the like. The metal leads 11 are sheared just outside the solder pools 16a shown in FIG. 8 so as to leave the solder pools 16a to the metal leads 11. The side portion 4c of carrier film 4 are separated away from the film 4, after metal leads 11 were sheared in the above mentioned manner, as shown in FIG. 10. Thereafter, resin is covered over the metal leads 11 as shown in FIG. 9. The reason for removing the side portions 4c and 4d from the carrier film 4 resides in that the side portion 4c left to the metal lead 11 after the soldering process may induce static electricity or may be influenced by noise-pulse induction.

As described above, according to the present invention, as solder layers 15 are formed on the metal leads 11 by electroplating, a constant amount of solder can be provided to bonding portions with uniform thickness. And as each of the metal leads 11 is bonded at the central portion 4b and side portion 4c (or 4d) of the carrier film 4, each of the connecting portions 13 of the metal leads 11 is prevented from being displaced or deformed and can be positioned in place. Further, as each of the connecting portions 13 of the metal leads 11 is arranged on the upper surface of the carrier film 4 and further pressed into the opening 4a in the carrier film 4 with the heat pressing head 42, the metal leads 11 are bonded to the connecting terminals 21 of the display panel 20 altogether and also the inclined portions 13b and 13c are formed at both sides of the central portions 13a of the connecting portions 13 altogether, whereby the bonding working is performed efficiently. The inclined portions 13b and 13c allow solder pools 16a and 16b to be formed between said inclined portions and the connecting terminals 21 of the display panel 20 thereby increasing the bonding strength. Furthermore, in the embodiments of the present invention, as the width of each of the connecting terminals 21 which are to be connected to the metal leads 11 is wider than half times the pitch of the connecting portions of the metal leads 11, the solder never either spreads over spans between the connecting terminals 21 or make a short-circuit, while each of the solder layers 15 forms solder pools 17a and 17b at both sides of the connecting portions 13 of the metal leads 11 for ensuring the firm bonding the connecting portion 13 and the connecting terminals 21.

What is claimed is:

1. A bonding structure of an electronic device, comprising:
    an insulating sheet having a central portion, a side portion and a connecting opening defined by said central portion and side portion;
    an electronic device having a plurality of electrodes arranged at a side edge thereof;
    a plurality of electrically conductive metal leads carried on at least one surface of said insulating sheet, said electrically conductive metal leads having ends electrically connected to said electrodes of said electronic device at said central portion of said insulating sheet and having in the vicinity of other ends thereof connecting portions which are received in said connecting opening, said other ends being carried by said side portion of said insulating sheet, said connecting portions being deformed so as to have a level part facing to the other surface of said insulating sheet and two inclined parts adjacent to said level part, said inclined parts rising up towards the upper edge of a wall of said central portion and side portion of said insulating sheet;
    a plurality of connecting terminals facing said connecting portions of said metal leads, respectively; and
    soldering layers for bonding said connecting portions of said metal leads and said connecting terminals to each other, each of said soldering layers including two pools which increase a thickness of a layer along said inclined parts of said metal leads.

2. A bonding structure according to claim 1, further comprising insulating adhesive means for covering said connecting portions of said metal leads.

3. A bonding structure according to claim 1, wherein each of said connecting terminals has a width broader than that of said connecting portions of said metal leads.

4. A bonding structure according to claim 3, wherein the width of each of said connecting portions of said metal leads is 0.5 to 0.8 times as wide as that of said connecting terminals.

5. A bonding structure according to claim 3, wherein the width of each of said connecting terminals is larger than 0.5 times their pitch and the width of each of said connecting portions of said metal leads is smaller than 0.5 times their pitch.

6. A bonding structure according to claim 1, wherein said connecting terminals include a gold layer, a nickel layer and an indium-tin oxide layer.

7. The bonding structure according to claim 4, further comprising solder pools at both side walls of said connecting portions of said metal leads.

8. The bonding structure according to claim 1, wherein;
    an overall outer surface of said metal leads exposed out of said insulating sheet are covered with solder layers; and
    each of said solder layers covering said connecting portion is thinner than that of a solder layer covering said end of said metal lead to be connected with said electrode of said electronic device.

9. The bonding structure according to claim 1, wherein said insulating layer further includes a second side portion and a second connecting opening defined by said central portion and said side portion.

10. The bonding structure according to claim 8, wherein said metal leads are extended to and carried on said second side portion and cross over said second connecting opening.

11. The bonding structure according to claim 10, wherein said second side portion is disposed at an opposite side of said first mentioned side portion.

12. The bonding structure according to claim 10, wherein said metal lead further includes:
    second connecting portions which are received in said second connecting opening, said connecting portions being deformed so as to have a level part facing to the other surface of said insulating sheet; and
    two inclined parts adjacent to said level part, said inclined parts rising up towards the upper edge of a wall of said central portion and said second side portion of said insulating sheet.

13. The bonding structure according to claims 12, further comprising:
    a plurality of second connecting terminals facing said second connecting portions of said metal leads, respectively; and
    second soldering layers for bonding said second connecting portions of said metal leads and said second connecting terminals to each other;

each of said second soldering layers including two pools which increase a thickness of layer along said inclined parts of said metal leads.

14. A bonding structure of an electronic device comprising:
   first and second substrates each substrate having a plurality of first and second connecting terminals;
   an integrated circuit unit interposed between said first and second substrates for electrically connecting electrodes of an integrated circuit chip to said first and second connecting terminals, and including:
   an insulating sheet having a central portion a first and second side portions, and a connecting opening located at least between said central portion and one of said first and second side portions; and a plurality of first and second electric conductive metal leads carried on one surface of said insulating sheet; each of said first and second metal leads having ends electrically connected to said electrodes of said integrated circuit chip at said central portion of said insulating sheet and the other ends at said first and second side portion; one of said first and second metal leads having in the vicinity of said the other ends deformed portions which are received in said connecting opening; said deformed portions being deformed so as to have a level part facing to the other surface of said insulating sheet and two inclined parts adjacent to said level parts, which inclined parts rise up towards the upper edge of wall of said central portion and one of said first and second side portion of said insulating sheet;
   and the bonding structure further comprising soldering layers for bonding said deformed portions of said metal leads and one of said first terminals, each of said soldering layers including two pools which increase the thickness of a layer along said inclined parts of said metal leads.

15. The bonding structure according to claim 14, wherein
   said first substrate comprises a panel of a liquid crystal display panel; and
   said second substrate comprises a printed circuit board.

16. The bonding structure according to claim 15, wherein said deformed portions of said metal leads are bonded to said connecting terminals of the panel of said liquid crystal display panel.

17. The bonding structure according to claim 15, wherein said deformed portions of said metal leads are bonded to said connecting terminals of said printed circuit board.

18. The bonding structure according to claim 14, wherein:
   said insulating sheet has two connecting openings respectively located between said central portion and said first side portion and between said central portion and said second side portion; and
   said first and second metal leads are respectively formed with deformed portions which are received in said first and second connecting openings so as to be bonded to said first and second connecting terminals of said first and second substrates at the other surface of said insulating sheet.

* * * * *